(12) United States Patent
King et al.

(10) Patent No.: US 10,659,887 B2
(45) Date of Patent: May 19, 2020

(54) HIGH EFFICIENCY TRANSDUCER DRIVER

(71) Applicant: Cirrus Logic International Semiconductor Ltd., Edinburgh (GB)

(72) Inventors: Eric J. King, Austin, TX (US); Christian Larsen, Austin, TX (US); Anthony S. Doy, Los Gatos, CA (US)

(73) Assignee: Cirrus Logic, Inc., Austin, TX (US)

( * ) Notice: Subject to any disclaimer, the term of this patent is extended or adjusted under 35 U.S.C. 154(b) by 6 days.

(21) Appl. No.: 16/001,596

(22) Filed: Jun. 6, 2018

(65) Prior Publication Data

US 2018/0376252 A1 Dec. 27, 2018

Related U.S. Application Data

(60) Provisional application No. 62/525,583, filed on Jun. 27, 2017.

(51) Int. Cl.
| | |
|---|---|
| *H03F 3/217* | (2006.01) |
| *H04R 17/00* | (2006.01) |
| *H03F 3/183* | (2006.01) |
| *H04R 3/00* | (2006.01) |
| *H03F 3/187* | (2006.01) |

(Continued)

(52) U.S. Cl.
CPC ............ *H04R 17/00* (2013.01); *H03F 3/183* (2013.01); *H03F 3/187* (2013.01); *H04R 3/00* (2013.01); *H02M 3/07* (2013.01); *H02M 3/1582* (2013.01); *H02M 2001/007* (2013.01); *H03F 2200/03* (2013.01); *H04R 1/1008* (2013.01); *H04R 1/1016* (2013.01)

(58) Field of Classification Search
CPC ........ H04R 17/00; H04R 3/00; H04R 1/1016; H04R 1/1008; H04R 2420/03; H04R 3/12; H03F 3/183; H03F 2200/03; H03F 3/187; H03F 1/32; H03F 3/45076; H03F 1/0211; H03F 1/0227; H03F 3/217; H03F 3/185; H03F 3/2173; H03F 3/45475; H03F 1/04; H03F 1/34; H03F 3/2171; H03F 2200/351; H03F 2200/432; H02M 3/07; H02M 2001/007; H02M 3/1582
USPC .............................................. 330/251, 207 A
See application file for complete search history.

(56) References Cited

U.S. PATENT DOCUMENTS

2011/0110000 A1\* 5/2011 Etter ...................... H02M 1/32
361/18
2016/0329734 A1\* 11/2016 Lee ........................ H02M 3/156

\* cited by examiner

*Primary Examiner* — Khanh V Nguyen
(74) *Attorney, Agent, or Firm* — Jackson Walker L.L.P.

(57) ABSTRACT

A system may include a charge pump configured to transfer electrical energy from a source of electrical energy coupled to an input of the charge pump to an energy storage device coupled to an output of the charge pump and configured to store the electrical energy transferred from the source of electrical energy, a power converter configured to transfer electrical energy from the energy storage device to an output of the power converter, wherein the power converter comprises a first plurality of switches and a power inductor arranged such that one switch of the first plurality of switches is coupled between the power inductor and the output of the charge pump, an output stage configured to transfer electrical energy between the output of the power converter to a load coupled to an output of the output stage, the output stage comprising a second plurality of switches, and a controller configured to generate an output voltage at the output of the output stage as an amplified version of an input signal.

20 Claims, 5 Drawing Sheets

(51) Int. Cl.
*H02M 3/07* (2006.01)
*H02M 1/00* (2006.01)
*H02M 3/158* (2006.01)
*H04R 1/10* (2006.01)

HIGH EFFICIENCY TRANSDUCER DRIVER

RELATED APPLICATION

The present disclosure claims priority to U.S. Provisional Patent Application Ser. No. 62/525,583, filed Jun. 27, 2017, which is incorporated by reference herein in its entirety.

FIELD OF DISCLOSURE

The present disclosure relates in general to circuits for audio devices, piezoelectric devices, and/or haptic-feedback devices, including without limitation personal audio devices such as wireless telephones and media players, and more specifically, to a high-efficiency driver for driving a transducer, including a piezoelectric transducer.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones, one or more speakers, a piezoelectric transducer, a haptic feedback transducer, and/or other transducer. Such circuitry often includes a driver including a power amplifier for driving a transducer output signal to the transducer. Oftentimes, a power converter may be used to provide a supply voltage to a power amplifier in order to amplify a signal driven to speakers, headphones, piezoelectric transducers, haptic feedback transducers, or other transducers. A switching power converter is a type of electronic circuit that converts a source of power from one direct current (DC) voltage level to another DC voltage level. Examples of such switching DC-DC converters include but are not limited to a boost converter, a buck converter, a buck-boost converter, an inverting buck-boost converter, and other types of switching DC-DC converters. Thus, using a power converter, a DC voltage such as that provided by a battery may be converted to another DC voltage used to power the power amplifier.

Battery-powered systems may use a boost converter to generate a power supply for an audio amplifier that is greater than a voltage of the battery. For example, a motivation of using a boost converter in a battery-powered transducer is to generate a greater signal swing at the output of a transducer amplifier than could be achieved by powering the amplifier directly from the battery. However, power consumption of a transducer driver system is often a concern, particularly in battery-powered devices, and methods and systems are desired to reduce power consumption and extend battery life over that of existing approaches.

SUMMARY

In accordance with the teachings of the present disclosure, one or more disadvantages and problems associated with existing approaches to driving a transducer may be reduced or eliminated.

In accordance with embodiments of the present disclosure, a system may include a charge pump configured to transfer electrical energy from a source of electrical energy coupled to an input of the charge pump to an energy storage device coupled to an output of the charge pump and configured to store the electrical energy transferred from the source of electrical energy, a power converter configured to transfer electrical energy from the energy storage device to an output of the power converter, wherein the power converter comprises a first plurality of switches and a power inductor arranged such that one switch of the first plurality of switches is coupled between the power inductor and the output of the charge pump, an output stage configured to transfer electrical energy between the output of the power converter to a load coupled to an output of the output stage, the output stage comprising a second plurality of switches, and a controller configured to control commutation of the first plurality of switches and the second plurality of switches in order to transfer charge to and from the load to generate an output voltage at the output of the output stage as an amplified version of an input signal.

In accordance with these and other embodiments of the present disclosure, a method may include transferring with a charge pump electrical energy from a source of electrical energy coupled to an input of the charge pump to an energy storage device coupled to an output of the charge pump and configured to store the electrical energy transferred from the source of electrical energy, transferring with a power converter electrical energy from the energy storage device to an output of the power converter, wherein the power converter comprises a first plurality of switches and a power inductor arranged such that one switch of the first plurality of switches is coupled between the power inductor and the output of the charge pump, transferring with an output stage electrical energy between the output of the power converter to a load coupled to an output of the output stage, the output stage comprising a second plurality of switches, and controlling commutation of the first plurality of switches and the second plurality of switches in order to transfer charge to and from the load to generate an output voltage at the output of the output stage as an amplified version of an input signal.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
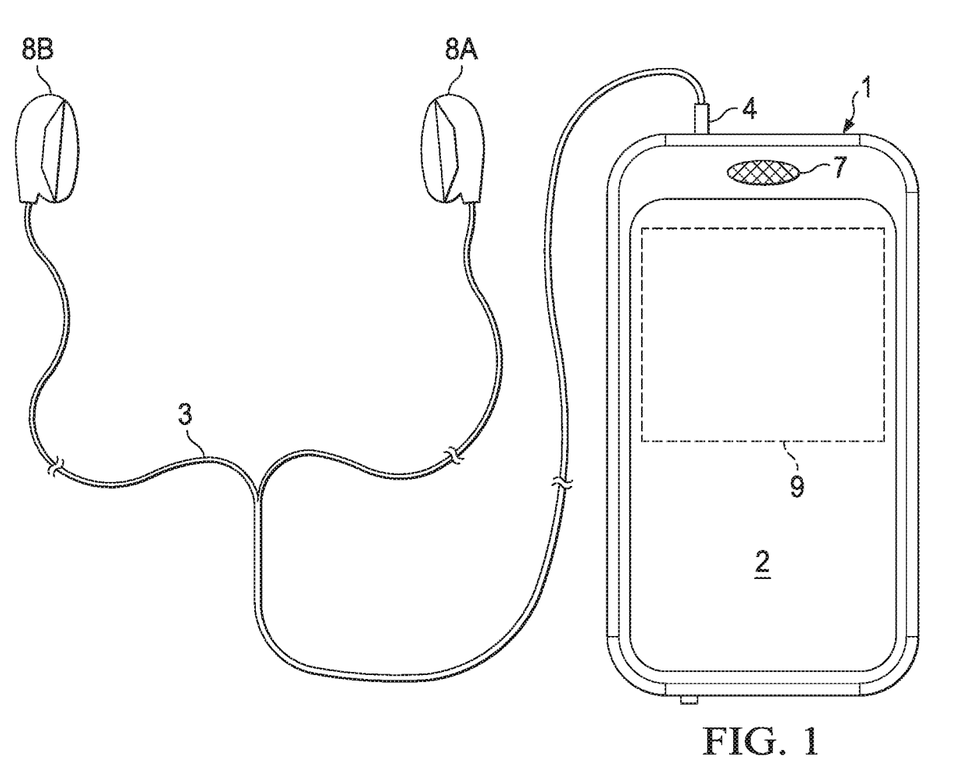
FIG. 1 illustrates an example personal mobile device, in accordance with embodiments of the present disclosure.

FIG. 1 illustrates an example personal mobile device 1, in accordance with embodiments of the present disclosure. FIG. 1 depicts personal mobile device 1 having a speaker 7. Speaker 7 is merely an example, and it is understood that personal mobile device 1 may be used in connection with a variety of transducers including magnetic coil loudspeakers, piezo speakers, haptic feedback transducers, and others. In addition or alternatively, personal mobile device 1 may be coupled to a headset 3 in the form of a pair of earbud speakers 8A and 8B. Headset 3 depicted in FIG. 1 is merely an example, and it is understood that personal mobile device 1 may be used in connection with a variety of audio transducers, including without limitation, headphones, earbuds, in-ear earphones, and external speakers. A plug 4 may provide for connection of headset 3 to an electrical terminal of personal mobile device 1. Personal mobile device 1 may provide a display to a user and receive user input using a touch screen 2, or alternatively, a standard liquid crystal display (LCD) may be combined with various buttons, sliders, and/or dials disposed on the face and/or sides of personal mobile device 1. As also shown in FIG. 1, personal mobile device 1 may include an integrated circuit (IC) 9 for generating an analog signal for transmission to speaker 7, headset 3, and/or another transducer.

Figure 2:
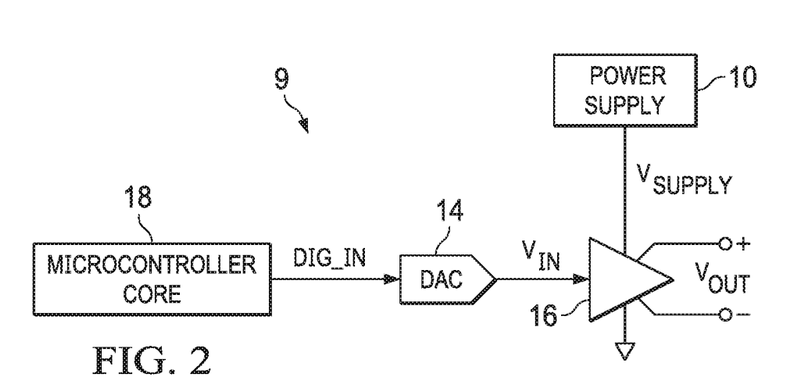
FIG. 2 illustrates a block diagram of selected components of an example integrated circuit of a personal mobile device for driving a transducer, in accordance with embodiments of the present disclosure.

FIG. 2 illustrates a block diagram of selected components of an example IC 9 of a personal mobile device for driving a transducer, in accordance with embodiments of the present disclosure. As shown in FIG. 2, a microcontroller core 18 may supply a digital input signal DIG_IN to a digital-to-analog converter (DAC) 14, which may convert the digital input signal to an analog input signal $V_{IN}$. DAC 14 may supply analog signal $V_{IN}$ to an amplifier 16 which may amplify or attenuate analog input signal $V_{IN}$ to provide a differential audio output signal $V_{OUT}$, which may operate a speaker, a headphone transducer, a piezoelectric transducer, a haptic feedback transducer, a line level signal output, and/or other suitable output. In some embodiments, DAC 14 may be an integral component of amplifier 16. A power supply 10 may provide the power supply rail inputs of amplifier 16. In some embodiments, power supply 10 may comprise a switched-mode power converter, as described in greater detail below. Although FIGS. 1 and 2 contemplate that IC 9 resides in a personal mobile device, systems and methods described herein may also be applied to electrical and electronic systems and devices other than a personal mobile device, including transducer systems for use in a computing device larger than a personal mobile device, an automobile, a building, or other structure.

Figure 3:
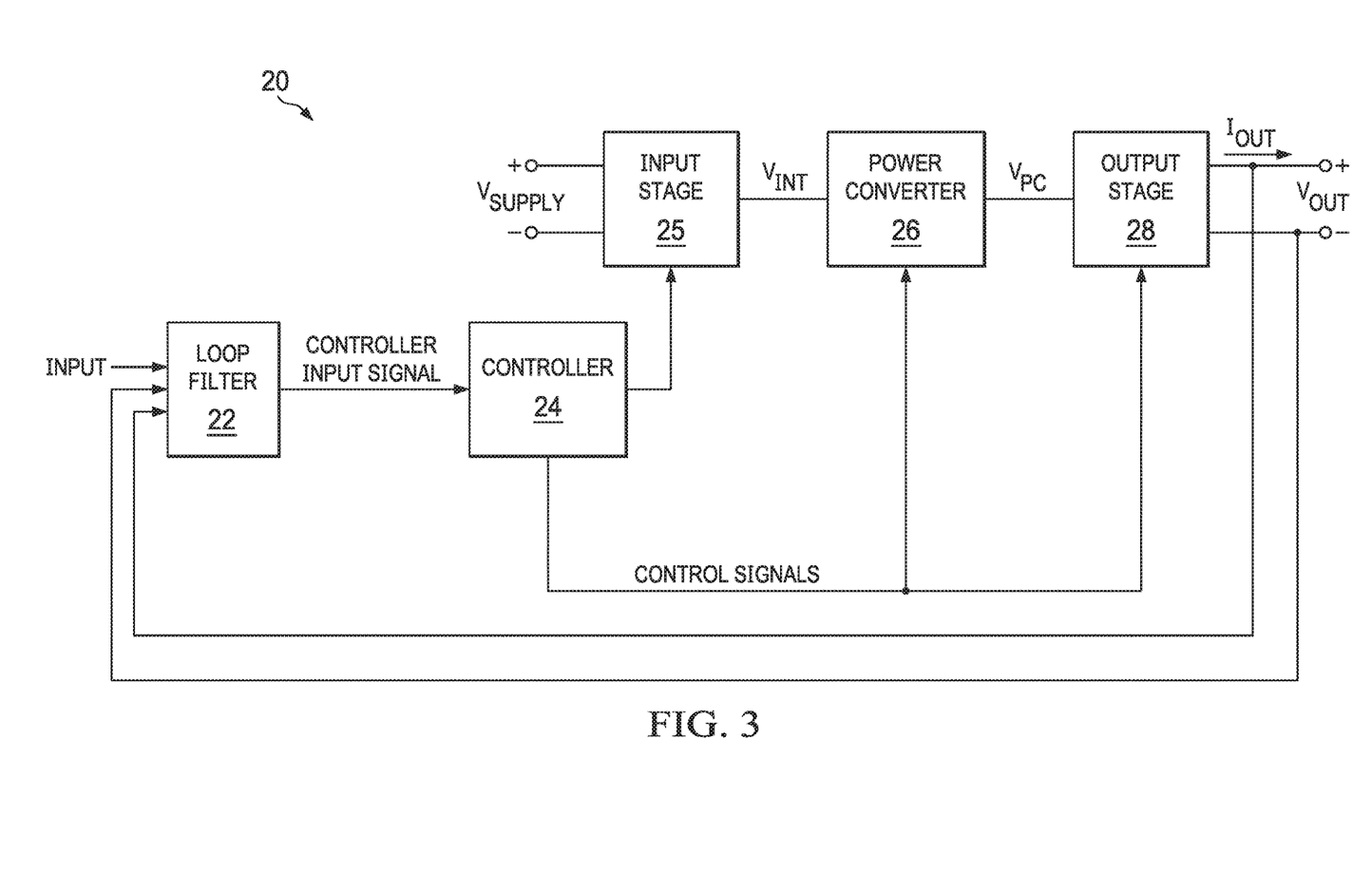
FIG. 3 illustrates a block and circuit diagram of selected components of an example switched mode amplifier, in accordance with embodiments of the present disclosure.

FIG. 3 illustrates a block and circuit diagram of selected components of an example switched mode amplifier 20, in accordance with embodiments of the present disclosure. In some embodiments, switched mode amplifier 20 may implement all or a portion of amplifier 16 described with respect to FIG. 2. As shown in FIG. 3, switched mode amplifier 20 may comprise a loop filter 22, a controller 24, an input stage 25, a power converter 26, and an output stage 28.

Loop filter 22 may comprise any system, device, or apparatus configured to receive an input signal (e.g., audio input signal $V_{IN}$ or a derivative thereof) and a feedback signal (e.g., audio output signal $V_{OUT}$, a derivative thereof, or other signal indicative of audio output signal $V_{OUT}$) and based on such input signal and feedback signal, generate a controller input signal to be communicated to controller 24. In some embodiments, such controller input signal may comprise a signal indicative of an integrated error between the input signal and the feedback signal. In other embodiments, such controller input signal may comprise a signal indicative of a target current signal to be driven as an output current $I_{OUT}$ or a target voltage signal to be driven as an output voltage $V_{OUT}$ to a load coupled to the output terminals of output stage 28.

Controller 24 may comprise any system, device, or apparatus configured to, based on an input signal (e.g., input signal INPUT), output signal $V_{OUT}$, and/or other characteristics of switched mode amplifier 20, control switching of switches integral to power converter 26, switches integral to output stage 28, and/or one or more linear amplifiers integral to output stage 28, in order to transfer electrical energy from a power supply $V_{SUPPLY}$ to the load of switched-mode amplifier 20 in accordance with the input signal.

Input stage 25 may comprise any system, device, or apparatus configured to, receive at its input a voltage $V_{SUPPLY}$ (e.g., provided by power supply 10), and may generate at its output an intermediate voltage $V_{INT}$. In some embodiments, voltage $V_{SUPPLY}$ may be received via input terminals of input stage 25 including a positive input terminal and a negative input terminal which may be coupled to a ground voltage. As described in greater detail in this disclosure (including, without limitation, in reference to FIG. 4, below), input stage 25 may include a charge pump, and a storage capacitor arranged to generate intermediate voltage $V_{INT}$ from voltage $V_{SUPPLY}$. For instance, in some embodiments, input stage 25 may operate as a voltage doubler such that $V_{INT}=2V_{SUPPLY}$.

Figure 4:
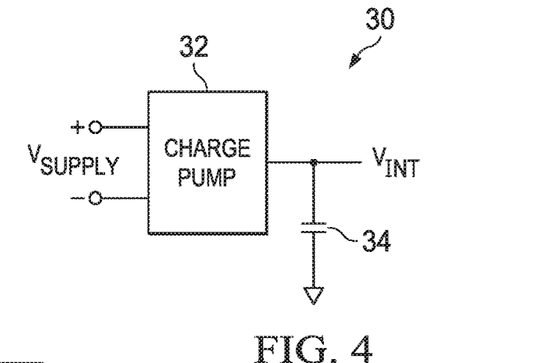
FIG. 4 illustrates a circuit diagram of selected components of an example input stage that may be used to implement the input stage depicted in FIG. 3, in accordance with embodiments of the present disclosure.

Turning briefly to FIG. 4, a non-limiting example of an input stage which may be used to implement input stage 25 is described. FIG. 4 illustrates a circuit diagram of selected components of an example input stage 30 that may be used to implement input stage 25 depicted in FIG. 3, in accordance with embodiments of the present disclosure. As shown in FIG. 4, input stage 30 may include a charge pump 32 and capacitor 34 arranged as shown.

Charge pump 32 may include any suitable arrangement of switches and capacitors to generate a desired intermediate voltage $V_{INT}$ from voltage $V_{SUPPLY}$. In operation, controller 24 may generate control signals to control switching of switching internal to charge pump 32 to generated desired intermediate voltage $V_{INT}$. In some embodiments, charge pump 32 may operate as a voltage doubler such that $V_{INT}=2V_{SUPPLY}$. In these and other embodiments, charge pump 32 may be configured such that electrical energy may be transferred from the input (e.g., voltage $V_{SUPPLY}$) of charge pump 32 to the output of charge pump 32 (e.g., intermediate voltage $V_{INT}$), but not vice versa.

Capacitor 34 may store electrical charge that provides intermediate voltage $V_{INT}$. Capacitor 34 may comprise any electrical component used to temporarily store electrical energy in an electric field. In some embodiments, capacitor 34 may be replaced with any other component capable of storing energy.

Turning again to FIG. 3, power converter 26 may receive at its input intermediate voltage $V_{INT}$ (e.g., provided by input stage 25), and may generate at its output a voltage $V_{PC}$. As described in greater detail in this disclosure (including, without limitation, in reference to FIG. 5, below), power converter 26 may comprise a power inductor and a plurality of switches that are controlled by control signals received from controller 24 in order to convert voltage $V_{SUPPLY}$ to voltage $V_{PC}$, such that audio output signal $V_{OUT}$ generated from voltage $V_{PC}$ is a function of the input signal to loop filter 22.

Figure 5:
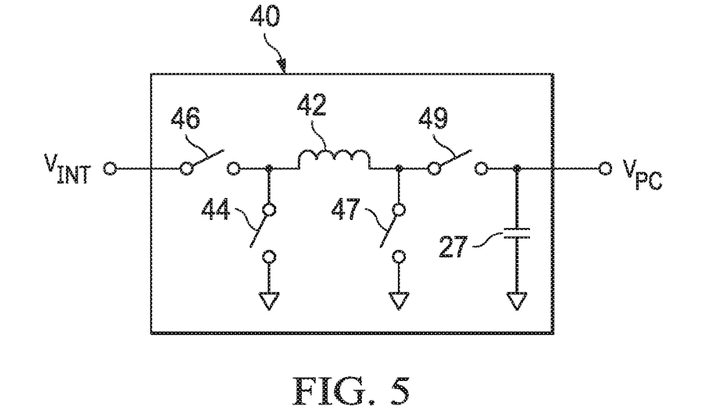
FIG. 5 illustrates a circuit diagram of selected components of an example buck-boost converter that may be used to implement the power converter depicted in FIG. 3, in accordance with embodiments of the present disclosure.

Turning briefly to FIG. 5, a non-limiting example of a single-ended switching mode power supply which may be used to implement power converter 26 is described. FIG. 5 illustrates a circuit diagram of selected components of an example buck-boost converter 40 that may be used to implement power converter 26 depicted in FIG. 3, in accordance with embodiments of the present disclosure. As shown in FIG. 5, buck-boost converter 40 may include a power inductor 42, switches 44, 46, 47, and 49 and capacitor 27 arranged as shown. Power inductor 42 may comprise any passive two-terminal electrical component which resists changes in electrical current passing through it and such that when electrical current flowing through it changes, a time-varying magnetic field induces a voltage in power inductor 42, in accordance with Faraday's law of electromagnetic induction, which opposes the change in current that created the magnetic field.

Each switch 44, 46, 47, and 49 may comprise any suitable device, system, or apparatus for making a connection in an electric circuit when the switch is enabled (e.g., activated, closed, or on) and breaking the connection when the switch is disabled (e.g., deactivated, open, or off) in response to a control signal received by the switch. For purposes of clarity and exposition, control signals for switches 44, 46, 47, and 49 (e.g., control signals communicated from controller 24) are not depicted, although such control signals would be present to selectively enable and disable switches 44, 46, 47, and 49. In some embodiments, a switch 44, 46, 47, and 49 may comprise an n-type metal-oxide-semiconductor field-effect transistor. Capacitor 27 may comprise any electrical component used to temporarily store electrical energy in an electric field. In some embodiments, capacitor 27 may be replaced with any other component capable of storing energy.

In operation, controller 24 may be configured to, when non-inverting buck-boost converter 40 is used to implement power converter 26, control switches 44, 46, 47, and 49 such that power converter output voltage $V_{PC}$ is a function of the controller input signal provided to controller 24.

Turning again to FIG. 3, output stage 28 may receive at its input the power converter output voltage $V_{PC}$, and may generate at its output audio output signal $V_{OUT}$. As described in greater detail in this disclosure (including, without limitation, in reference to FIG. 6, below), output stage 28 may comprise at least one linear amplifier and, in some embodiments, a plurality of switches, wherein the at least one linear amplifier and the plurality of switches, if present, are controlled by control signals received from controller 24 in order to convert power converter output voltage $V_{PC}$ to audio output signal $V_{OUT}$, such that audio output signal $V_{OUT}$ is a function of the input signal to loop filter 22.

Figure 6:
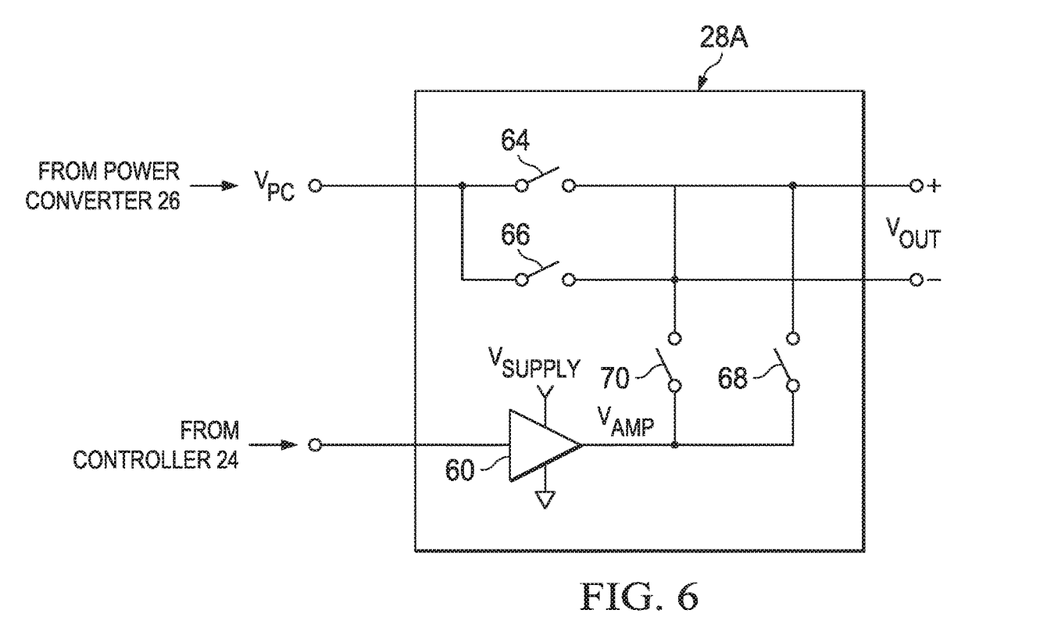
FIG. 6 illustrates a circuit diagram of selected components of an example output stage that may be used to implement the output stage depicted in FIG. 3, in accordance with embodiments of the present disclosure.

FIG. 6 illustrates a circuit diagram of selected components of an example output stage 28A that may be used to implement output stage 28 depicted in FIG. 3, in accordance with embodiments of the present disclosure. As shown in FIG. 6, power converter 26 may drive power converter output voltage $V_{PC}$. Output stage 28A may comprise a plurality of switches including switch 64 coupled between the power converter output and a first output terminal of output stage 28A and switch 66 coupled between the power converter output and a second output terminal of output stage 28A. In addition, output stage 28A may include a linear amplifier 60 configured to drive a linear amplifier output voltage $V_{AMP}$. Output stage 28A may also include a plurality of switches including switch 68 coupled between the output of linear amplifier 60 and a first output terminal of output stage 28A and switch 70 coupled between the output of linear amplifier 60 and a second output terminal of output stage 28A.

In operation of output stage 28A, controller 24 may activate switches 64 and 70 and deactivate switches 66 and 68 for positive values of audio output signal $V_{OUT}$ and activate switches 66 and 68 and deactivate switches 64 and 70 for negative values of audio output signal $V_{OUT}$. Controller 24 may, as power converter output voltage $V_{PC}$ approaches a lower saturation limit, cause linear amplifier 60 to drive a non-zero linear amplifier output voltage $V_{AMP}$ in order to increase a common mode voltage between the first output terminal and the second output terminal, allowing audio output signal $V_{OUT}$ to approach and cross zero. Above the lower saturation limit of power converter output voltage $V_{PC}$, controller 24 may cause linear amplifier 60 to drive an approximately zero linear amplifier output voltage $V_{AMP}$ such that a magnitude of audio output signal $V_{OUT}$ is equal to power converter output voltage $V_{PC}$.

Figure 7:
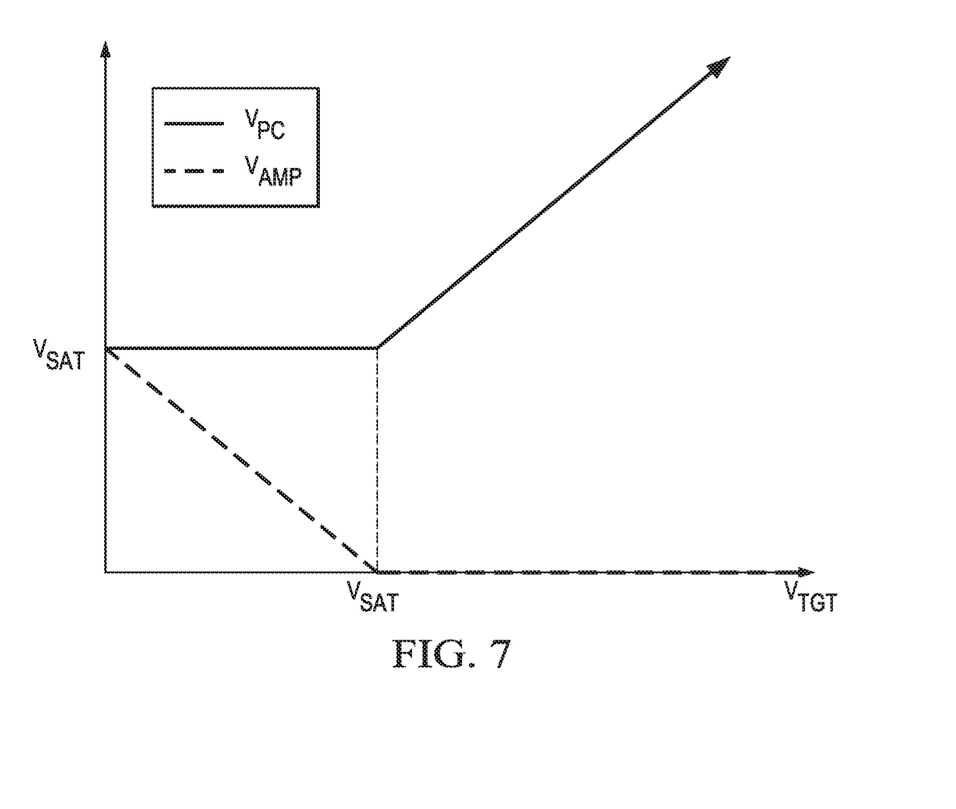
FIG. 7 illustrates a graph depicting the relationship of a voltage driven by the power converter depicted in FIG. 3 and a voltage driven by a linear amplifier of the output stage depicted in FIG. 3 as a function of a desired output voltage, in accordance with embodiments of the present disclosure.

In other words, controller 24 may control power converter 26 and linear amplifier 60 to generate voltages in accordance with the following functions, which are graphically depicted in FIG. 7, and wherein voltage $V_{TGT}$ represents a target or desired voltage to be output as audio output signal $V_{OUT}$ as indicated by the input signal to controller 24:

$$V_{PC}=V_{TGT}; \text{ for } |V_{TGT}|>V_{SAT}$$

$$V_{PC}=V_{SAT}; \text{ for } |V_{TGT}|\leq V_{SAT}$$

$$V_{AMP}=0; \text{ for } |V_{TGT}|>V_{SAT}$$

$$V_{AMP}=V_{SAT}-V_{TGT}; \text{ for } |V_{TGT}|\leq V_{SAT}$$

In some embodiments, an offset voltage may be added to each of the output of power converter 26 and the output of linear amplifier 60, to ensure that the voltage $V_{AMP}>0$ at all times.

Accordingly, the presence of linear amplifier 60 and its ability to increase the common mode voltage of the output terminals in response to low magnitudes of the output signal $V_{OUT}$ may minimize non-linearities of output signal $V_{OUT}$ as a function of the input signal received by controller 24, and permit crossing a magnitude of zero by audio output signal $V_{OUT}$.

Additional details regarding the functionality of non-inverting buck-boost converter 40 in connection with output stage 28A may be found in U.S. patent application Ser. No. 15/270,631, filed Sep. 20, 2016 (the '631 application), which is incorporated by reference herein.

Figure 8:
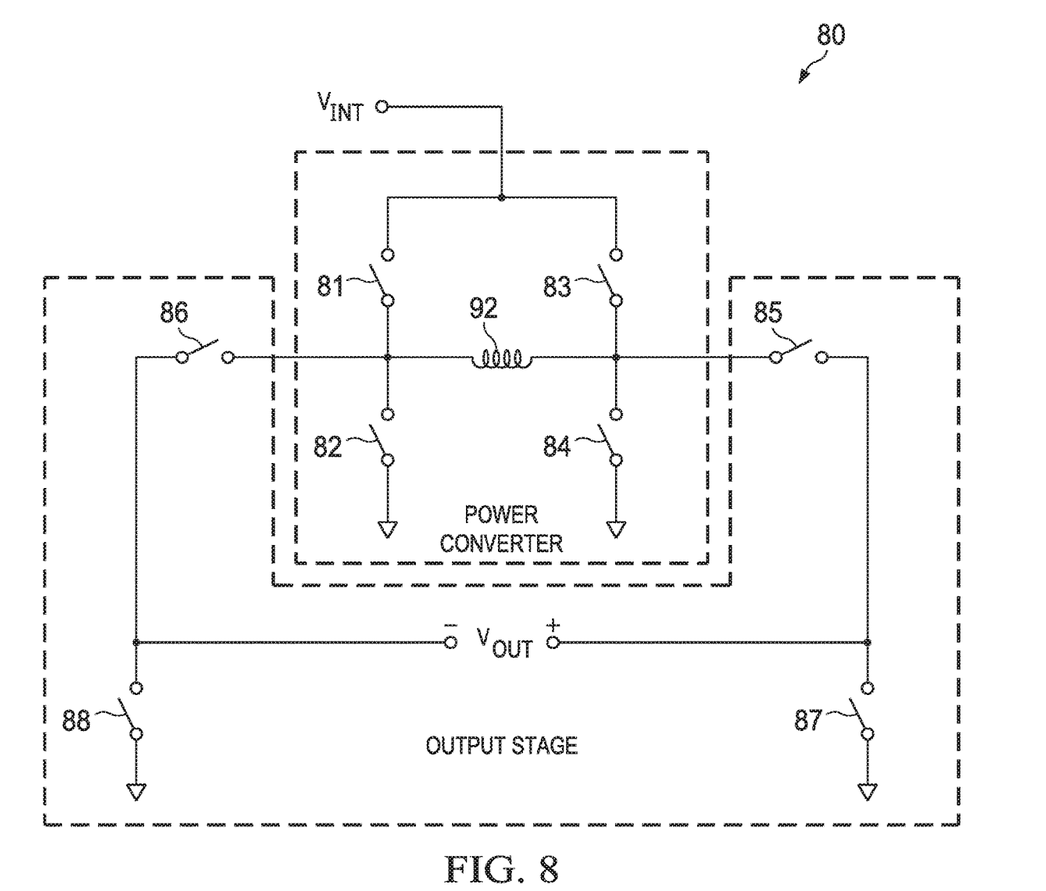
FIG. 8 is a block diagram of selected components of an example switched-mode amplifier that may be used to implement the power converter and output stage depicted in FIG. 3, in accordance with embodiments of the present disclosure.

FIG. 8 is a block diagram of selected components of an example switched-mode amplifier 80 that together may be used to implement power converter 26 and output stage 28 depicted in FIG. 3, in accordance with embodiments of the present disclosure. For example, as shown in FIG. 8, switches 81-84 and power inductor 92 may implement power converter 26 depicted in FIG. 3 and switches 85-88 may implement output stage 28 depicted in FIG. 3. As shown in FIG. 8, switched-mode amplifier 80 may receive intermediate voltage $V_{INT}$ generated by input stage 25.

Switched-mode amplifier 80 may comprise a power inductor 92 and a plurality of switches 81-88. Power inductor 92 may comprise any passive two-terminal electrical component which resists changes in electrical current passing through it and such that when electrical current flowing through it changes, a time-varying magnetic field induces a voltage in power inductor 92, in accordance with Faraday's law of electromagnetic induction, which opposes the change in current that created the magnetic field.

Each switch 81-88 may comprise any suitable device, system, or apparatus for making a connection in an electric circuit when the switch is enabled (e.g., activated, closed, or on) and breaking the connection when the switch is disabled (e.g., deactivated, open, or off) in response to a control signal received by the switch. For purposes of clarity and exposition, control signals for switches 81-88 (e.g., control signals communicated from controller 24) are not depicted, although such control signals would be present to selectively enable and disable switches 81-88. In some embodiments, a switch 81-88 may comprise an n-type metal-oxide-semiconductor field-effect transistor.

In operation, switches 81-88 may be controlled by controller 24 such that switched-mode amplifier 80 operates in a plurality of modes including at least a boost mode in which switched-mode amplifier 80 generates its output voltage (e.g., output voltage $V_{OUT}$) greater than its input voltage (e.g., intermediate voltage $V_{INT}$) and a buck mode in which switched-mode amplifier 80 generates its output voltage (e.g., output voltage $V_{OUT}$) lesser than its input voltage (e.g., intermediate voltage $V_{INT}$). In addition, when switched-mode amplifier 80 is used to implement power converter 26 and output stage 28, controller 24 may control switches 81-88 such that output voltage $V_{OUT}$ is a function of the controller input signal provided to controller 24. Additional details regarding the functionality of switched-mode amplifier 80 may be found in U.S. patent application Ser. No. 15/283,839, filed Oct. 3, 2016 (the '839 application), which is incorporated by reference herein.

The main difference between the methods and systems disclosed herein as compared to the methods and systems of the '631 application and the '839 application is that the methods and systems disclosed herein include input stage 25 having a charge pump 32 and a capacitor 34 that is not present in the '631 application and the '839 application. In other words, the present disclosure contemplates the placement of a charge pump between a source of electrical energy (e.g., a battery) at an input of the charge pump and an input of a power converter, such that a switch of the power converter is coupled between a power inductor of the power converter and an output of the charge pump.

Capacitor 34 of FIG. 4 as used in amplifier 20 of FIG. 3 may serve many purposes. First, capacitor 34 may serve as an output to charge pump 32, so that charge pump 32 may generate the intermediate voltage $V_{INT}$ from which power converter 26 may boost or buck from. Second, capacitor 34 may serve as an input for a current mode output of amplifier 20. To illustrate, the last two stages of amplifier 20, shown in FIGS. 5 and 6, may implement a current-mode amplifier whose input is capacitor 34, which topology allows charge to be moved from capacitor 34 to an output load driven by amplifier 20, particularly in embodiments in which the output load is a capacitive load, such as when the output load is a piezoelectric transducer.

Third, capacitor 34 may serve as an energy storage device in order to transfer charge from the output of amplifier 20 (e.g., from output voltage $V_{OUT}$) to capacitor 34 for decreasing levels of output voltage $V_{OUT}$, particularly in cases in which a load coupled to the output of amplifier 20 is a mainly capacitive load, such as may be the case when the load is a piezoelectric transducer. Unlike traditional loudspeakers and other transducers which may be primarily resistive, piezoelectric transducers and/or other transducers may be capable of storing charge as an incidence of their operation in a capacitance of such transducer device. Accordingly, energy stored in such a transducer may be returned to another energy storage device (e.g., capacitor 34) until again required by the output load, thus potentially reducing energy required from a battery or other supply to the boost converter. Thus, electrical energy may "ping pong" between such an output transducer and an energy storage device, with additional energy only being required due to resistive losses of the driving circuitry (e.g., switches of power converter 26 and output stage 28) and resistive elements of the load itself. By using charge pump 32 and capacitor 34 as shown and described herein, stored energy maintained within a power inductor of power converter 26 may be greatly reduced as compared to architectures in which input stage 25 is not present (e.g., when power converter 26 received supply voltage $V_{SUPPLY}$ as its input). Such reduction in energy storage within a power inductor may in turn reduce current flowing through the various switches of power converter 26 and/or output stage 28 to maintain operation of amplifier 20, thereby decreasing power consumption over architectures in which input stage 25 is not present.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. A system comprising:
a charge pump configured to transfer electrical energy from a source of electrical energy coupled to an input of the charge pump to an energy storage device coupled to an output of the charge pump and configured to store the electrical energy transferred from the source of electrical energy;
a power converter configured to transfer electrical energy from the energy storage device to an output of the power converter, wherein the power converter comprises a first plurality of switches and a power inductor arranged such that one switch of the first plurality of switches is coupled between the power inductor and the output of the charge pump;
an output stage configured to transfer electrical energy between the output of the power converter to a load coupled to an output of the output stage, the output stage comprising a second plurality of switches; and
a controller configured to control commutation of the first plurality of switches and the second plurality of switches in order to transfer charge to and from the load to generate an output voltage at the output of the output stage as an amplified version of an input signal.

2. The system of claim 1, wherein the energy storage device comprises a capacitor.

3. The system of claim 1, wherein the load comprises a piezoelectric transducer.

4. The system of claim 3, wherein the piezoelectric transducer comprises a second energy storage device.

5. The system of claim 1, wherein the output stage comprises a switched-mode full bridge comprising the second plurality of switches.

6. The system of claim 1, wherein the power converter comprises a switched-mode power supply with the first plurality of switches configured to be controlled such that the power converter operates in a plurality of modes comprising at least:
a boost mode in which the power converter generates a voltage at the output of the power converter greater than a voltage received at the input of the power converter; and
a buck mode in which the power converter generates the voltage at the output of the power converter smaller than the voltage received at the input of the power converter.

7. The system of claim 1, wherein the output stage comprises a linear amplifier configured to drive one of the terminals of the load.

8. The system of claim 7, further comprising a third plurality of switches configured to transfer electrical energy between the output of the linear amplifier to the load and wherein the controller is further configured to control the first plurality of switches, the second plurality of switches, the third plurality of switches, and the linear amplifier in order to generate the output voltage as a function of the input signal to the controller such that energy delivered to the load output is supplied predominantly by the power converter.

9. The system of claim 1, wherein the input signal is an audio signal.

10. The system of claim 1, wherein the controller is further configured to:
control commutation of the second plurality of switches in order to transfer charge back and forth between the load and the energy storage device in order to generate an output voltage at the output of the output stage as an amplified version of an input signal; and
control commutation of the first plurality of switches in order to provide additional electrical energy from the source of electrical energy to the load and the energy storage device to replace electrical energy dissipated by the system.

11. A method comprising:
transferring with a charge pump electrical energy from a source of electrical energy coupled to an input of the charge pump to an energy storage device coupled to an output of the charge pump and configured to store the electrical energy transferred from the source of electrical energy;
transferring with a power converter electrical energy from the energy storage device to an output of the power converter, wherein the power converter comprises a first plurality of switches and a power inductor arranged such that one switch of the first plurality of switches is coupled between the power inductor and the output of the charge pump;
transferring with an output stage electrical energy between the output of the power converter to a load coupled to an output of the output stage, the output stage comprising a second plurality of switches; and
controlling commutation of the first plurality of switches and the second plurality of switches in order to transfer charge to and from the load to generate an output voltage at the output of the output stage as an amplified version of an input signal.

12. The method of claim 11, wherein the energy storage device comprises a capacitor.

13. The method of claim 11, wherein the load comprises a piezoelectric transducer.

14. The method of claim 13, wherein the piezoelectric transducer comprises a second energy storage device.

15. The method of claim 11, wherein the output stage comprises a switched-mode full bridge comprising the second plurality of switches.

16. The method of claim 11, wherein the power converter comprises a switched-mode power supply, and the method further comprising controlling the first plurality of switches such that the power converter operates in a plurality of modes comprising at least:
a boost mode in which the power converter generates a voltage at the output of the power converter greater than a voltage received at the input of the power converter; and
a buck mode in which the power converter generates the voltage at the output of the power converter smaller than the voltage received at the input of the power converter.

17. The method of claim 11, wherein the output stage comprises a linear amplifier configured to drive one of the terminals of the load.

18. The method of claim 17, further comprising controlling the first plurality of switches, the second plurality of switches, a third plurality of switches configured to transfer electrical energy between the output of the linear amplifier to the load, and the linear amplifier in order to generate the output voltage as a function of the input signal to the controller such that energy delivered to the load output is supplied predominantly by the power converter.

19. The method of claim 11, wherein the input signal is an audio signal.

20. The method of claim 11, further comprising:
controlling commutation of the second plurality of switches in order to transfer charge back and forth between the load and the energy storage device in order to generate an output voltage at the output of the output stage as an amplified version of an input signal; and
controlling commutation of the first plurality of switches in order to provide additional electrical energy from the source of electrical energy to the load and the energy storage device to replace electrical energy dissipated by a system comprising the load, the energy storage device, the charge pump, the power converter, and the output stage.

* * * * *